(12) United States Patent
Lin et al.

(10) Patent No.: US 7,267,755 B2
(45) Date of Patent: Sep. 11, 2007

(54) METHOD OF MAKING A MICROSTRUCTURE USING A CIRCUIT BOARD

(75) Inventors: Jao-Ching Lin, Hsin-Chuang (TW); Pei-Pei Ding, Hsin-Chuang (TW)

(73) Assignee: Sentelic Corporation, Taipei (TW)

( * ) Notice: Subject to any disclaimer, the term of this patent is extended or adjusted under 35 U.S.C. 154(b) by 556 days.

(21) Appl. No.: 10/670,190

(22) Filed: Sep. 26, 2003

(65) Prior Publication Data

US 2005/0000816 A1  Jan. 6, 2005

(30) Foreign Application Priority Data

Jul. 4, 2003  (TW) ............... 92118325 A (51) Int. Cl.
*C25D 1/00* (2006.01)
*H05K 1/02* (2006.01)
(52) U.S. Cl. ............ 205/67; 205/78; 205/125; 427/98.4; 427/99.5
(58) Field of Classification Search ............ 205/67, 205/70, 125, 78
See application file for complete search history.

(56) References Cited

U.S. PATENT DOCUMENTS 6,468,439 B1 * 10/2002 Whitehurst et al. ........... 216/95
2002/0027129 A1   3/2002 Heerman

FOREIGN PATENT DOCUMENTS

| CH | 681 758     | 5/1993  |
|----|-------------|---------|
| DE | 40 12 100   | 10/1991 |
| JP | 2003-200396 | 7/2003  |

* cited by examiner

*Primary Examiner*—Roy King
*Assistant Examiner*—William T. Leader
(74) *Attorney, Agent, or Firm*—Lowe Hauptman Ham & Berner LLP (57) ABSTRACT

A method of making a microstructure includes the steps of providing a circuit board that includes a dielectric layer and a conductor layer formed on the dielectric layer, forming a metal structure on the circuit board such that the metal structure extends through the dielectric layer, and removing at least a portion of the dielectric layer adjacent to the conductor layer and the metal structure to result in the microstructure.

6 Claims, 15 Drawing Sheets

METHOD OF MAKING A MICROSTRUCTURE USING A CIRCUIT BOARD

CROSS-REFERENCE TO RELATED APPLICATION

This application claims priority of Taiwanese application no. 092118325, filed on Jul. 04, 2003.

BACKGROUND OF THE INVENTION

1. Field of the Invention

The invention relates to a method of making a microstructure, more particularly to a method of making a microstructure using a circuit board.

2. Description of the Related Art

Conventional process technologies, such as precision micro machining, electro-discharge micro machining, laser micro machining, bulk micro machining, surface micro machining, and LIGA (lithography, electroforming and molding), for fabricating microstructures are well known in the art. However, each of the aforesaid process technologies has its drawback. The conventional precision, electro-discharge and laser micro machining process technologies are capable of fabricating microstructures with high aspect ratios, but use non-batch processing techniques. Conversely, the conventional bulk and surface micro machining process technologies use batch processing techniques, but are not capable of fabricating microstructures with high aspect ratios. The conventional LIGA process technology is capable of fabricating microstructures with high aspect ratios and uses batch processing techniques, but at a relatively high cost.

In German Patent Nos. DE197397197 and DE19739722, there is disclosed a conventional method of making the microstructure using circuit boards. The method comprises the steps of patterning the printed circuit boards and stacking the printed circuit boards one above the other to form fluid channel microstructures. Although the method proposed therein permits microstructure fabrication using batch processing techniques and at a relatively low cost, it is not suited for fabricating microstructures with high aspect ratios.

SUMMARY OF THE INVENTION

Therefore, the object of the present invention is to provide a method of making high aspect ratio microstructures that uses batch processing techniques at a relatively low cost.

According to one aspect of the present invention, a method of making a microstructure comprises the steps of: providing a circuit board that includes a dielectric layer having a first surface and a second surface opposite to the first surface, and a conductor layer formed on the first surface of the dielectric layer; forming a metal structure on the circuit board such that the metal structure extends from the first conductor layer toward the second surface of the dielectric layer; and removing at least a portion of the dielectric layer adjacent to the first conductor layer and the metal structure to result in the microstructure having one side defined by the conductor layer.

According to another aspect of the present invention, a method of making a hollow microstructure comprises the steps of: providing a circuit board that includes a dielectric layer having a first surface and a second surface opposite to the first surface, and a conductor layer formed on the first surface of the dielectric layer; patterning one of the first and second surfaces of the dielectric layer; forming a hole unit in the dielectric layer that extends from the patterned one of the first and second surfaces to the other of the first and second surfaces of the dielectric layer; and disposing a cover member on the second surface of the dielectric layer.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 1:
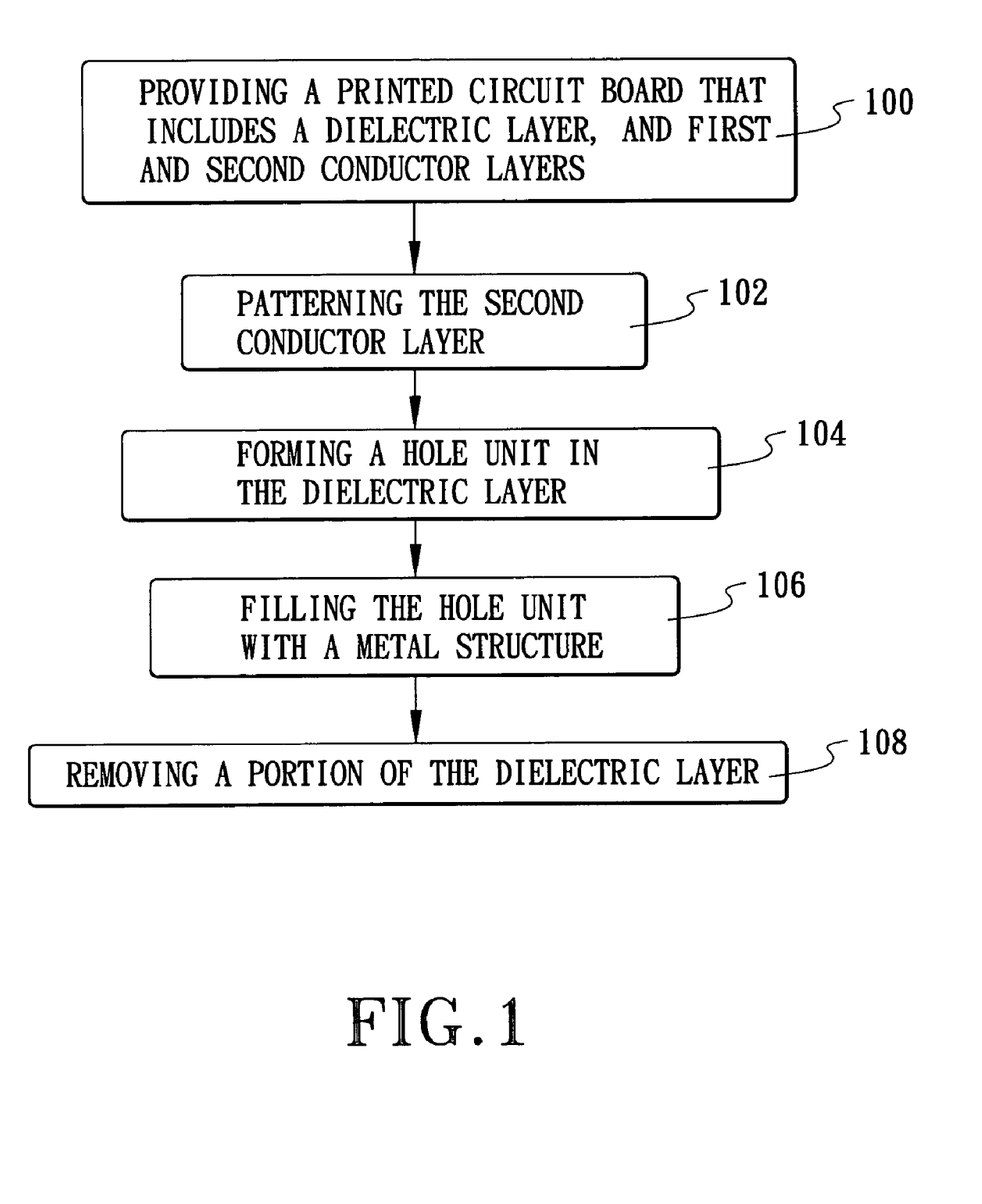
FIG. 1 is a flowchart of the first preferred embodiment of a method of making a microstructure using a circuit board according to the present invention.

The first preferred embodiment of a method for making a microstructure according to this invention includes the steps as shown in FIG. 1.

Figure 2:
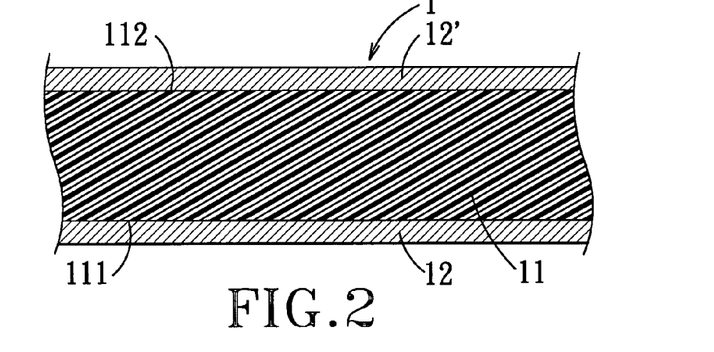
FIG. 2 is a fragmentary sectional view to illustrate a circuit board having a dielectric layer, and first and second conductor layers formed on opposite surfaces of the dielectric layer prepared according to the method of the first preferred embodiment.

In step 100, with further reference to FIG. 2, a printed circuit board 1 is provided. The printed circuit board 1 includes a dielectric layer 11 that has a first surface 111 and a second surface 112 opposite to the first surface 111, and a first conductor layer 12 formed on the first surface 111 of the dielectric layer 11. In this embodiment, the dielectric layer 11 is made from epoxy resin.

The printed circuit board 1 further includes a second conductor layer 12' formed on the second surface 112 of the dielectric layer 11. In this embodiment, the first and second conductor layers 12, 12' are made from copper foil.

Figure 3:
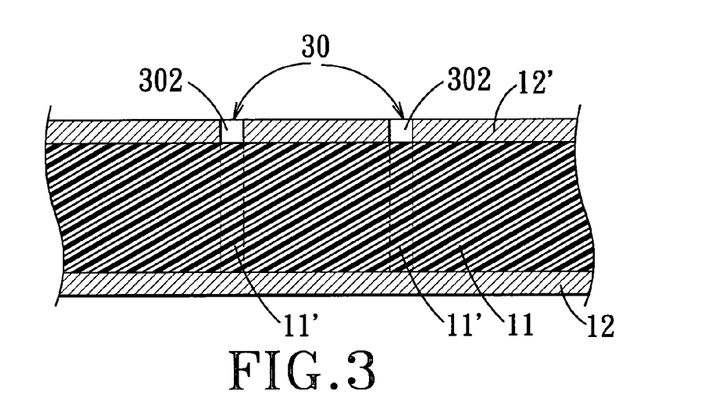
FIG. 3 is a fragmentary sectional view to illustrate how the dielectric layer is patterned in the method of the first preferred embodiment.

In step 102, with further reference to FIG. 3, the second conductor layer 12' is patterned to expose parts 11' of the second surface 112 of the dielectric layer 11. In this embodiment, the second conductor layer 12' is patterned with two parallel lines 30. The second conductor layer 12' is then etched, in a known manner, to form recesses 302 in the second conductor layer 12' corresponding to the pattern 30.

Figure 4:
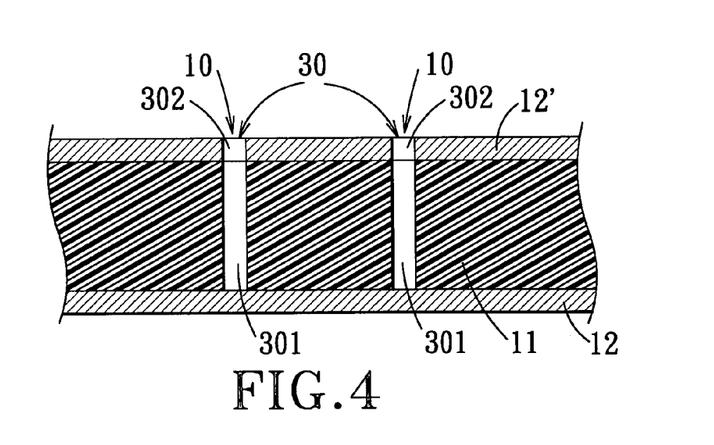
FIG. 4 is a fragmentary sectional view to illustrate how a hole unit is formed in the dielectric layer according to the method of the first preferred embodiment.

In step 104, with further reference to FIG. 4, a hole unit 10 is formed in the exposed parts 11' (see FIG. 3) of the second surface 112 of the dielectric layer 11. The hole unit 10 includes first and second holes 301. In this embodiment, each of the first and second holes 301 of the hole unit 10 extends from the second surface 112 to the first surface 111. Preferably, the hole unit 10 is formed by dry etching. In an alternative embodiment, the hole unit 10 is formed by wet etching.

Figure 5:
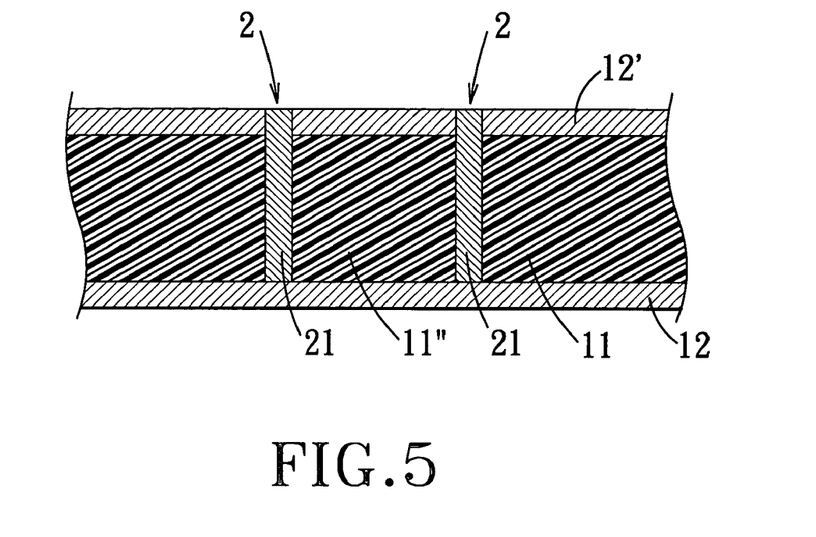
FIG. 5 is a fragmentary sectional view to illustrate how the hole unit is filled with a metal structure in the method of the first preferred embodiment.

In step 106, with further reference to FIG. 5, the hole unit 10 (see FIG. 4) is filled with a metal structure 2. The metal structure 2 includes first and second metal members 21. In this embodiment, each of the first and second metal members 21 of the metal structure 2 extends from the first conductor layer 12 into the second conductor layer 12'. Moreover, each of the first and second metal members 21 of the metal structure 2 electrically interconnects the first and second conductor layers 12, 12'. Further, each of the first and second metal members 21 of the metal structure 2 is preferably made from copper. The metal structure 2 may be formed by electroforming or electrodeposition. In an alternative embodiment, each of the first and second metal members 21 of the metal structure 2 thermally interconnects the first and second conductor layers 12, 12'.

Figure 6:
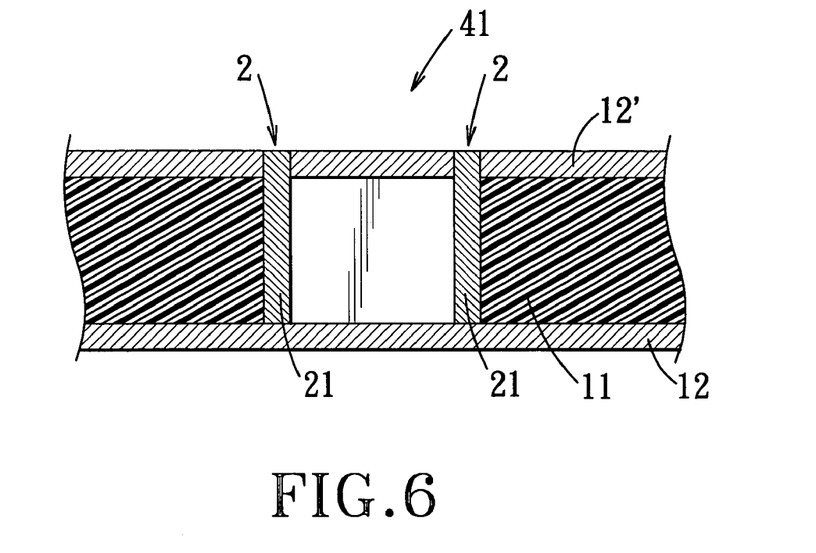
FIG. 6 is a fragmentary sectional view to illustrate how a portion of the dielectric layer is removed in the method of the first preferred embodiment.

In step 108, with further reference to FIGS. 6 to 9, a portion 11" (see FIG. 5) of the dielectric layer 11 is removed to result in the microstructure 41. The removed portion 11" of the dielectric layer 11 is adjacent to the first and second conductor layers 12, 12', and the first and second metal members 21 of the metal structure 2. In this embodiment, as best shown in FIG. 6, the microstructure 41 is a hollow microstructure that has four sides defined by the first and second metal members 21 of the metal structure 2, and the first and second conductor layers 12, 12'. The microstructure 41 of this embodiment is suitable for applications, such as fluid transport, mixing, and flow control. Preferably, the removal of the portion 11" of the dielectric layer 11 is conducted through wet etching. In alternative embodiments, the removal of the portion 11" of the dielectric layer 11 is conducted through one of laser ablation, dry etching, precision machining and pyrolysis.

Figure 7:
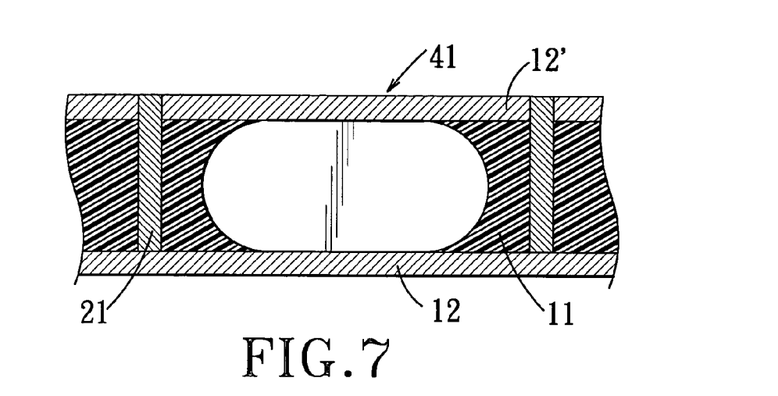
FIGS. 7 to 9 are fragmentary sectional views to illustrate various shapes formed after removal of the portion of the dielectric layer according to the method of the first preferred embodiment.
Figure 8:
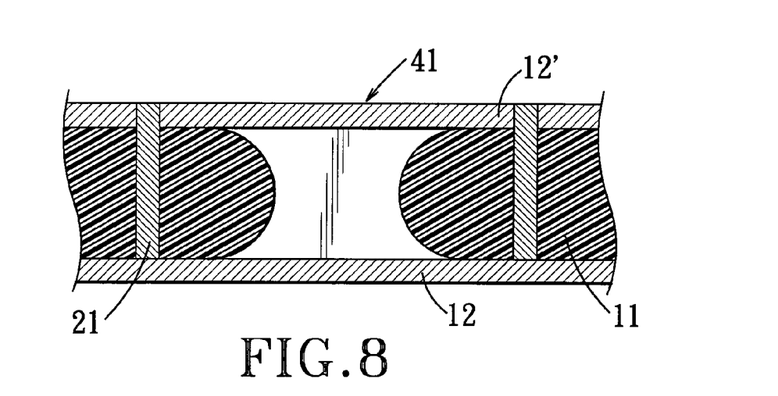
Figure 9:
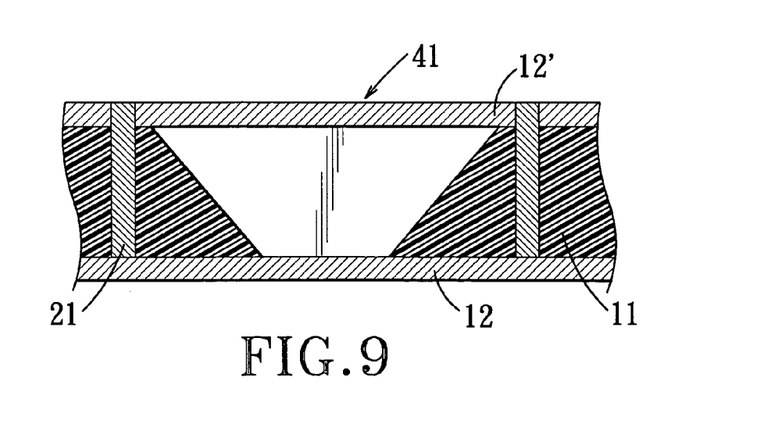

The portion 11" of the dielectric layer 11 may be removed to form various shapes to suit different applications, as best shown in FIGS. 7 to 9.

Figure 10:
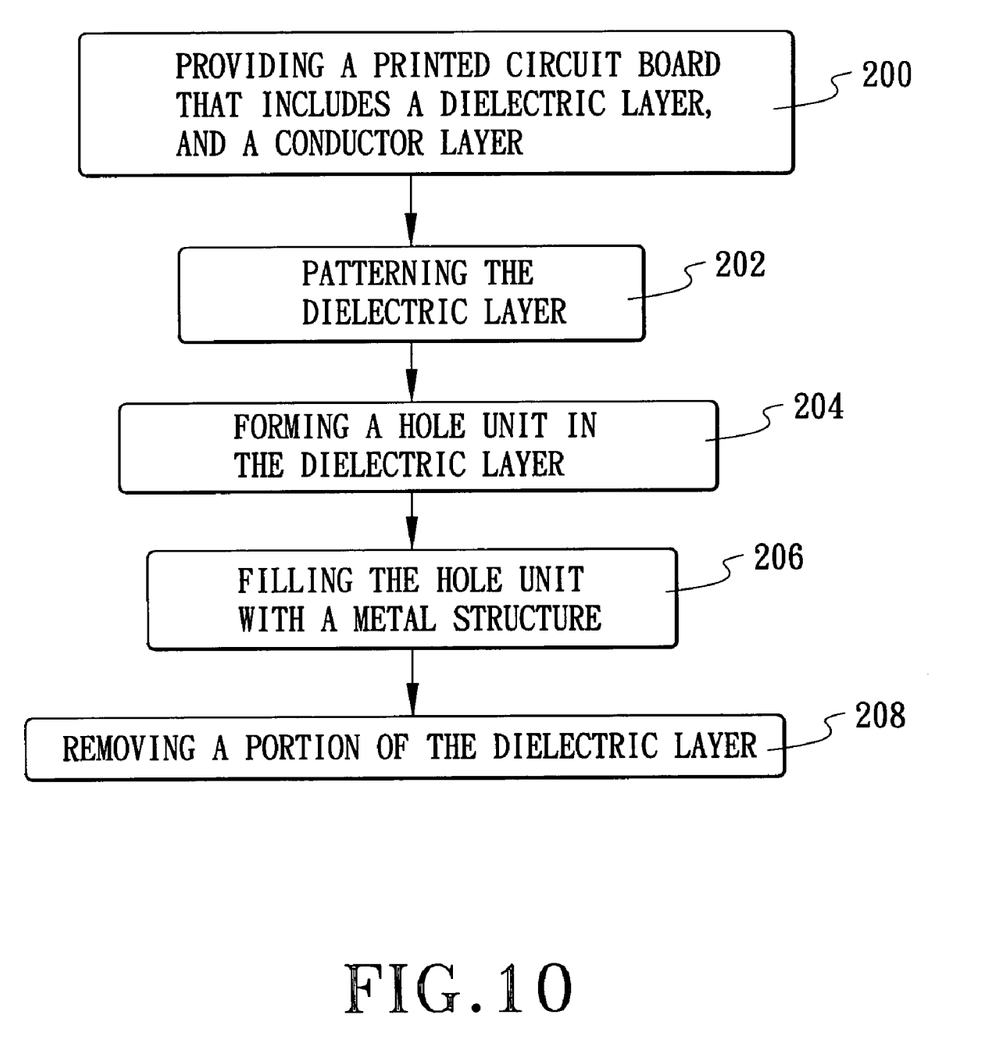
FIG. 10 is a flowchart of the second preferred embodiment of a method of making a microstructure using a circuit board according to the present invention.

The second preferred embodiment of a method for making a microstructure according to this invention includes the steps as shown in FIG. 10.

Figure 11:
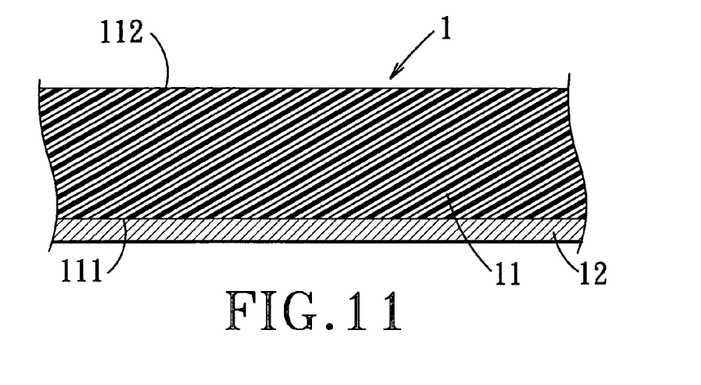
FIG. 11 is a fragmentary sectional view to illustrate a circuit board having a dielectric layer, and a conductor layer prepared according to the method of the second preferred embodiment.

In step 200, with further reference to FIG. 11, a printed circuit board 1 is provided. The printed circuit board 1 includes a dielectric layer 11 that has a first surface 111 and a second surface 112 opposite to the first surface 111, and a conductor layer 12 formed on the first surface 111 of the dielectric layer 11. In this embodiment, the dielectric layer 11 is made from epoxy resin. The conductor layer 12 is made from copper foil.

Figure 12:
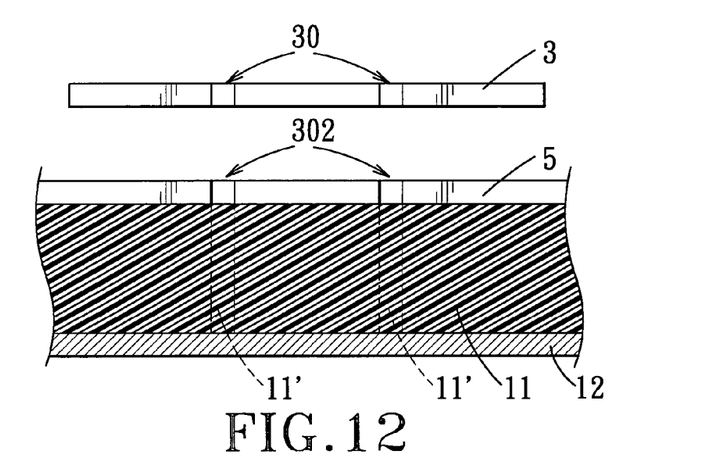
FIG. 12 is a fragmentary sectional view to illustrate how the dielectric layer is patterned in the method of the second preferred embodiment.

The printed circuit board 1 further includes a photo-resist layer 5 coated on the second surface 112 of the dielectric layer 11, as best shown in FIG. 12.

In step 202, with further reference to FIG. 12, the photo-resist layer 5 is patterned to expose parts 11' of the second surface 112 of the dielectric layer 11. A photo-mask 3 is patterned with two parallel lines of a pattern 30 and is then placed above the photo-resist layer 5. The printed circuit board 1 is subsequently exposed to radiation for transferring the pattern 30 on the photo-mask 3 to the photo-resist layer 5. A developing solution is used to form recesses 302 in the photo-resist layer 5 corresponding to the pattern 30.

Figure 13:
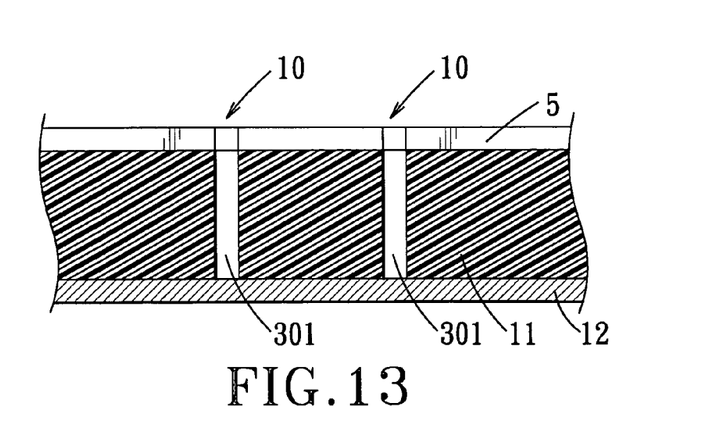
FIG. 13 is a fragmentary sectional view to illustrate how a hole unit is formed in the dielectric layer according to the method of the second preferred embodiment.

In step 204, with further reference to FIG. 13, a hole unit 10 is formed in the exposed parts 11' (see FIG. 12) of the second surface 112 of the dielectric layer 11. The hole unit 10 includes first and second holes 301. In this embodiment, each of the first and second holes 301 of the hole unit 10 extends from the second surface 112 to the first surface 111. Preferably, the hole unit 10 is formed by dry etching. In an alternative embodiment, the hole unit 10 is formed by wet etching.

Figure 14:
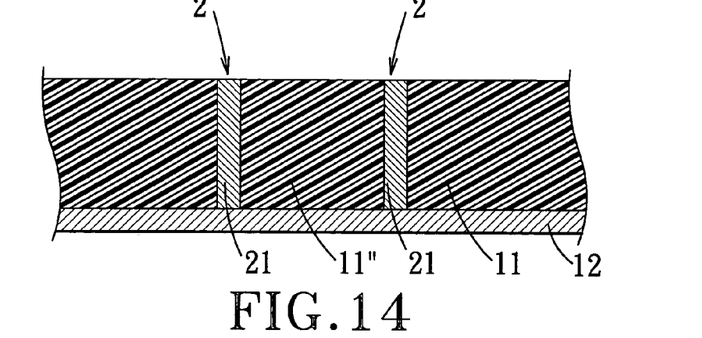
FIG. 14 is a fragmentary sectional view to illustrate how the hole unit is filled with a metal structure in the method of the second preferred embodiment.

In step 206, with further reference to FIG. 14, the hole unit 10 (see FIG. 13) is filled with a metal structure 2. The metal structure 2 includes first and second metal members 21. In this embodiment, each of the first and second metal members 21 of the metal structure 2 extends from the first conductor layer 12 to the second surface 112 of the dielectric layer 11. Preferably, the metal structure 2 is formed by electroforming.

Figure 15:
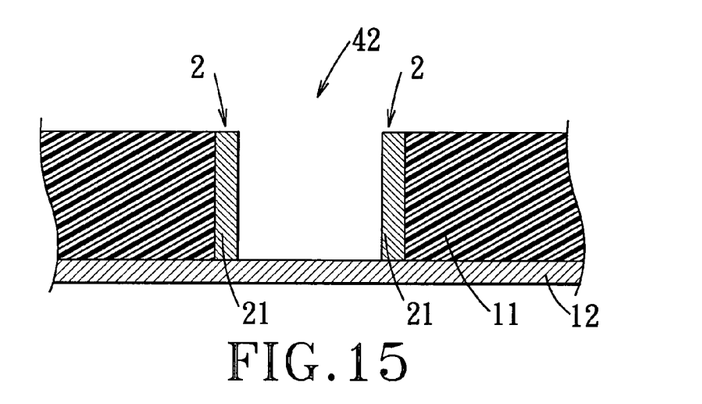
FIG. 15 is a fragmentary sectional view to illustrate how a portion of the dielectric layer is removed in the method of the second preferred embodiment.

In step 208, with further reference to FIG. 15, a portion 11" (see FIG. 14) of the dielectric layer 11 is removed to result in the microstructure 42. The removed portion 11" of the dielectric layer 11 is adjacent to the conductor layer 12, and the first and second metal members 21 of the metal structure 2. In this embodiment, the microstructure 42 is a micro-groove structure that has three sides defined by the first and second metal members 21 of the metal structure 2, and the conductor layer 12. The microstructure 42 of this embodiment is suitable for applications such as fluid conduction and heat exchange. Preferably, the removed portion 11" of the dielectric layer 11 is removed by wet or dry etching.

Figure 16:
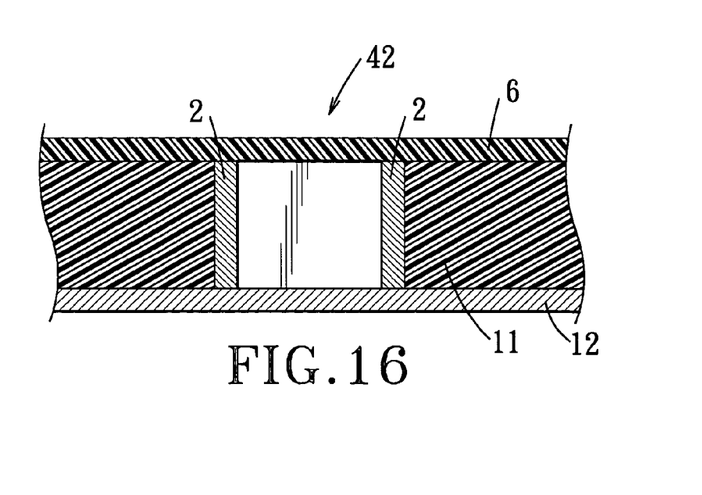
FIG. 16 is a fragmentary sectional view to illustrate a cover member disposed on the dielectric layer according to the method of the second preferred embodiment.

An example of an application of the microstructure 42 of this embodiment is illustrated in FIG. 16. A cover member 6 (e.g. a printed circuit board or a protective layer of a chip) is disposed on the second surface 112 of the dielectric layer 11 to cover an opening of the microstructure 42. The microstructure 42 serves as a cooling system for the cover member 6. The cover member 6 is bonded to the metal structure 2 with the use of a bonding material (not shown), such as glue. If the cover member 6 is made from metal, it can be bonded to the metal structure 2 by diffusion bonding, soldering, brazing, or diffusion soldering.

Figure 17:
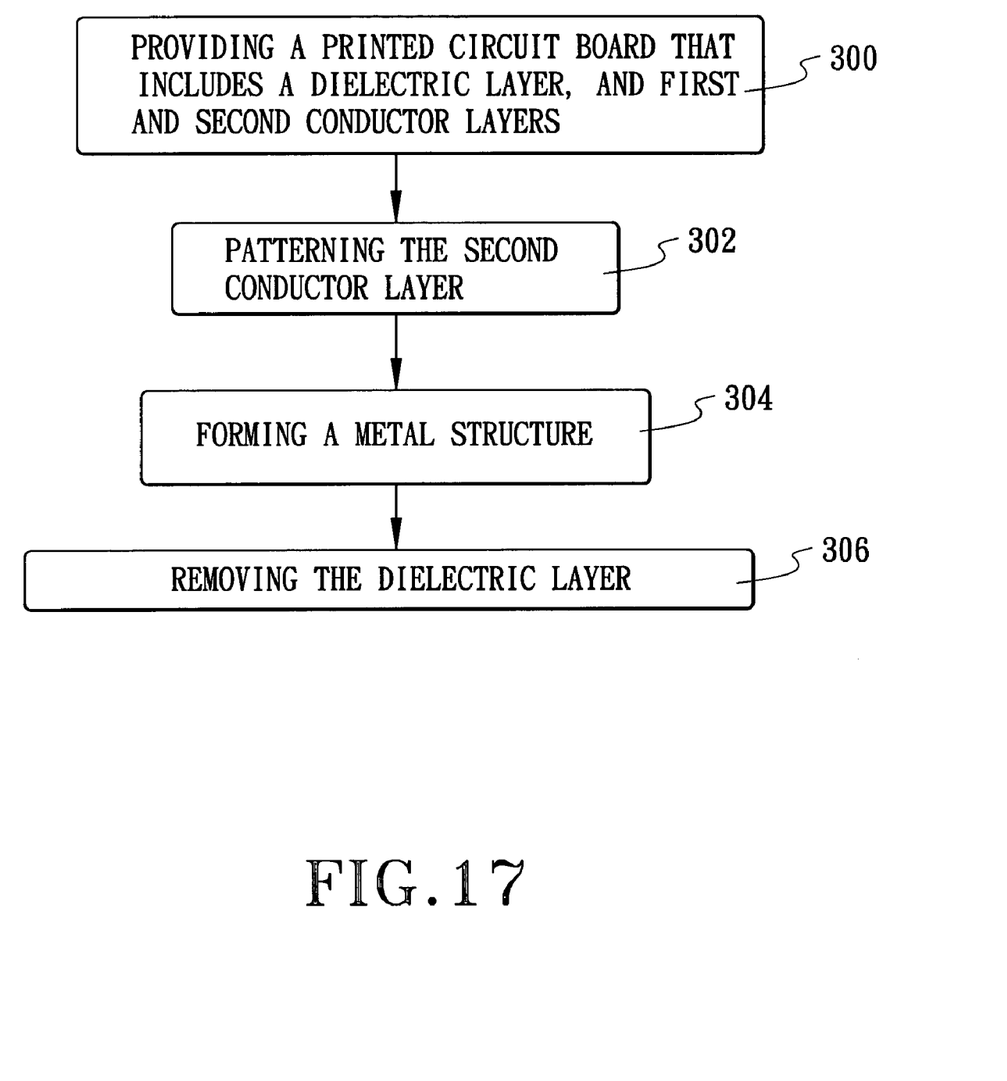
FIG. 17 is a flowchart of the third preferred embodiment of a method of making a microstructure using a circuit board according to the present invention.

The third preferred embodiment of a method for making a microstructure according to this invention includes the steps as shown in FIG. 17.

Figure 18:
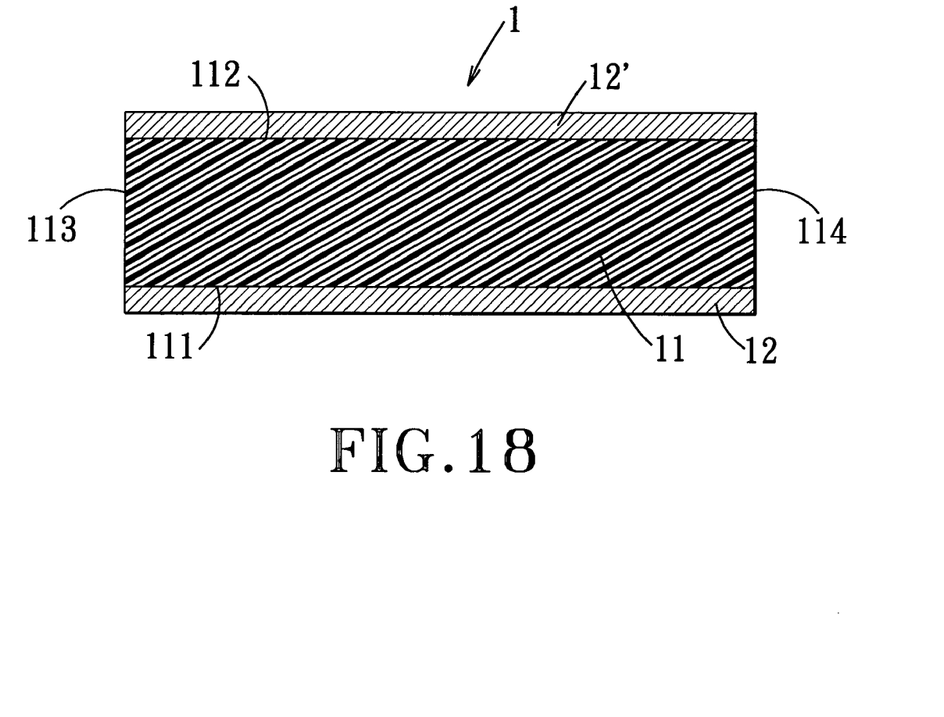
FIG. 18 is a sectional view to illustrate a circuit board having a dielectric layer, and first and second conductor layers prepared according to the method of the third preferred embodiment.

In step 300, with further reference to FIG. 18, a printed circuit board 1 is provided. The printed circuit board 1 includes a dielectric layer 11 that has a first surface 111, a second surface 112 opposite to the first surface 111, and opposite edges 113, 114 that interconnect the first and second surfaces 111, 112. In this embodiment, the dielectric layer 11 is made from epoxy resin.

The printed circuit board 1 further includes first and second conductor layers 12, 12'. Each of the first and second conductor layers 12, 12' is formed on a respective one of the first and second surfaces 111, 112. In this embodiment, the first and second conductor layers 12, 12' are made from copper foil.

Figure 19:
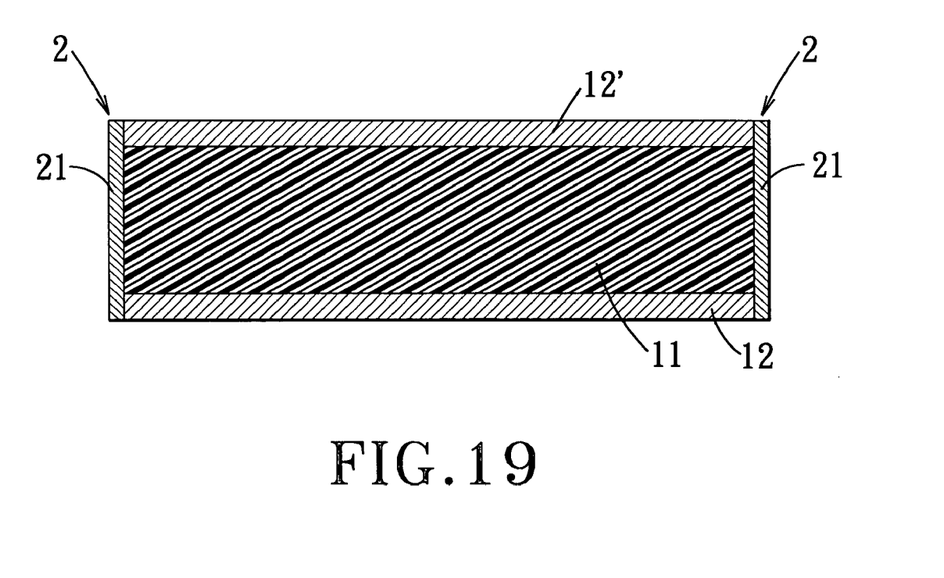
FIG. 19 is a sectional view to illustrate a metal structure formed on opposite edges of the dielectric layer according to the method of the third preferred embodiment.

In step 302, with further reference to FIG. 19, a metal structure 2 is formed on the printed circuit board 1. The metal structure 2 includes first and second metal members 21 formed on the opposite edges 113, 114. In this embodiment, each of the first and second metal members 21 of the metal structure 2 extends from the first conductor layer 12 to the second conductor layer 12'. Preferably, the metal structure 2 is formed by electroforming.

Figure 20:
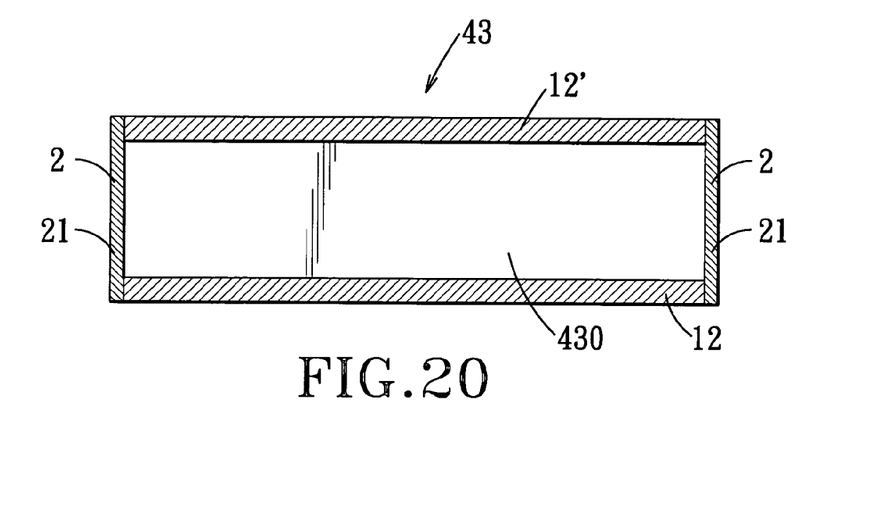
FIG. 20 is a sectional view to illustrate how removal of the dielectric layer is conducted in the method of the third preferred embodiment.

In step 304, with further reference to FIG. 20, the dielectric layer 11 is removed in its entirety to result in the microstructure 43. Therefore, in this embodiment, the microstructure 43 is a hollow microstructure that has four sides defined by the first and second metal members 21 of the metal structure 2, and the first and second conductor layers 12, 12'. The microstructure 43 of this embodiment is suitable for applications, such as fluid buffering, storing and dispensing. Preferably, the removal of the dielectric layer 11 is conducted through wet etching. In another embodiment, the removal of the dielectric layer 11 is conducted by first forming a hole through one of the first and second conductor layers 12, 12', and the first and second metal members 21 of the metal structure 2. The dielectric layer 11 is then removed through precision micro machining. In yet another embodiment, the dielectric layer 11 is removed through laser ablation.

Figure 21:
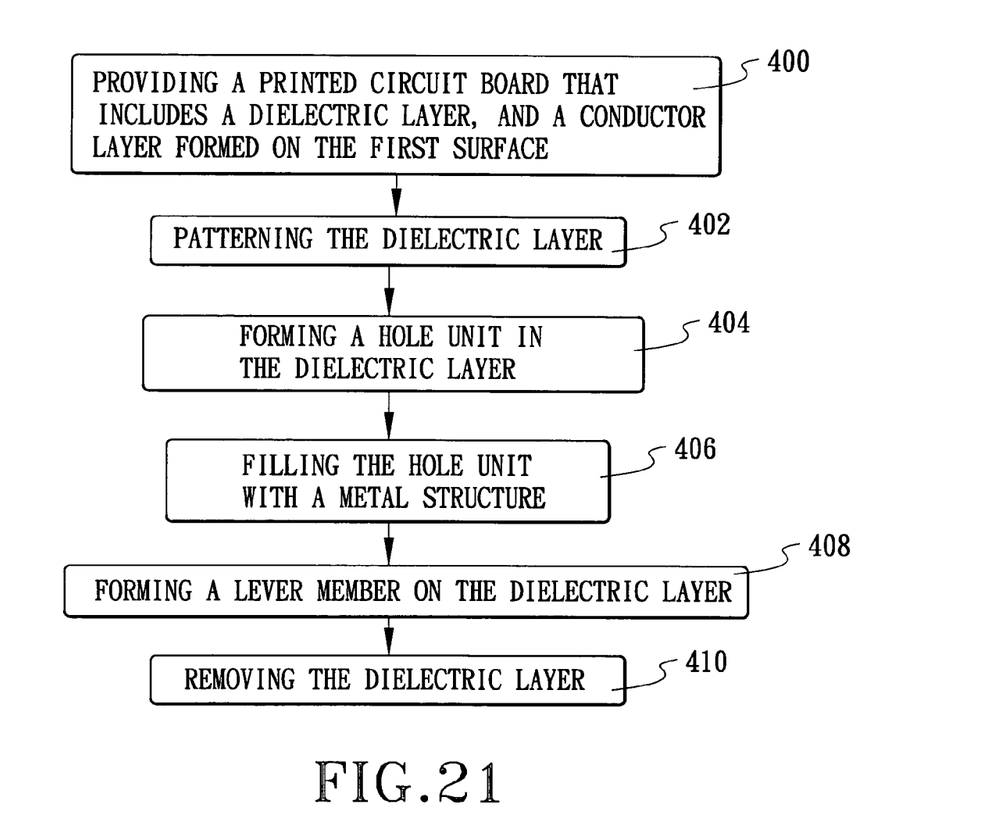
FIG. 21 is a flowchart of the fourth preferred embodiment of a method of making a microstructure using a circuit board according to the present invention.

The fourth preferred embodiment of a method for making a microstructure according to this invention includes the steps as shown in FIG. 21.

Figure 22:
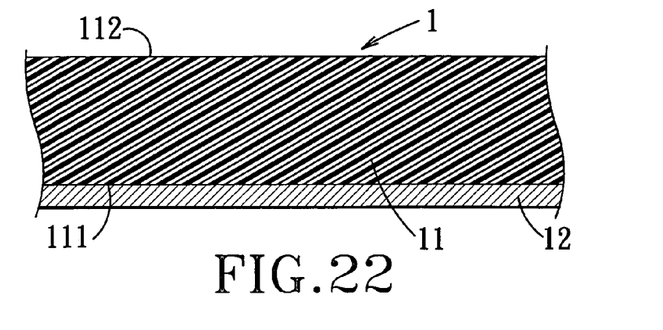
FIG. 22 is a fragmentary sectional view to illustrate a circuit board having a dielectric layer, and a conductor layer prepared according to the method of the fourth preferred embodiment.

In step 400, with further reference to FIG. 22, a printed circuit board 1 is provided. The printed circuit board 1 includes a dielectric layer 11 that has a first surface 111 and a second surface 112 opposite to the first surface 111, and a conductor layer 12 formed on the first surface 111. In this embodiment, the dielectric layer 11 is made from epoxy resin. The conductor layer 12 is made from copper foil.

Figure 23:
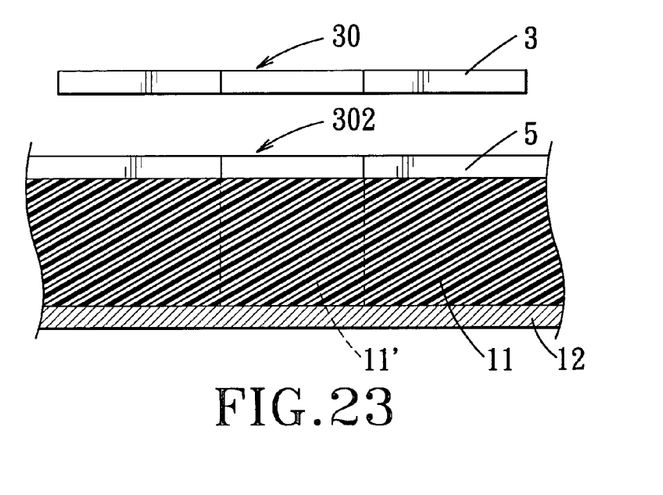
FIG. 23 is a fragmentary sectional view to illustrate how the dielectric layer is patterned in the method of the fourth preferred embodiment.

The printed circuit board 1 further includes a photo-resist layer 5 coated on the second surface 112 of the dielectric layer 11, as best shown in FIG. 23.

In step 402, with further reference to FIG. 23, the photo-resist layer 5 is patterned to expose a part 11' of the second surface 112 of the dielectric layer 11. A photo-mask 3 is patterned with a circle of a pattern 30 and is then placed above the photo-resist layer 5. The printed circuit board 1 is subsequently exposed to radiation for transferring the pattern 30 on the photo-mask 3 to the photo-resist layer 5. A developing solution is used to form a recess 302 in the photo-resist layer 5 corresponding to the pattern 30.

Figure 24:
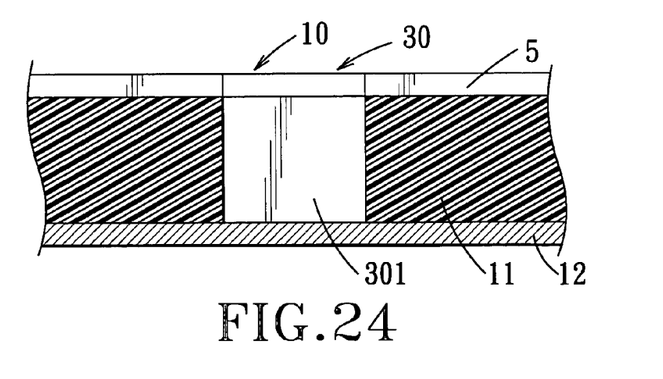
FIG. 24 is a fragmentary sectional view to illustrate how a hole unit is formed in the dielectric layer in the method of the fourth preferred embodiment.

In step 404, with further reference to FIG. 24, a hole unit 10 is formed in the exposed part 11' (see FIG. 23) of the second surface 112 of the dielectric layer 11. The hole unit 10 includes a hole 301. In this embodiment, the hole 301 of the hole unit 10 extends from the second surface 112 to the first surface 111. Preferably, the hole 301 of the hole unit 10 is formed by dry or wet etching.

Figure 25:
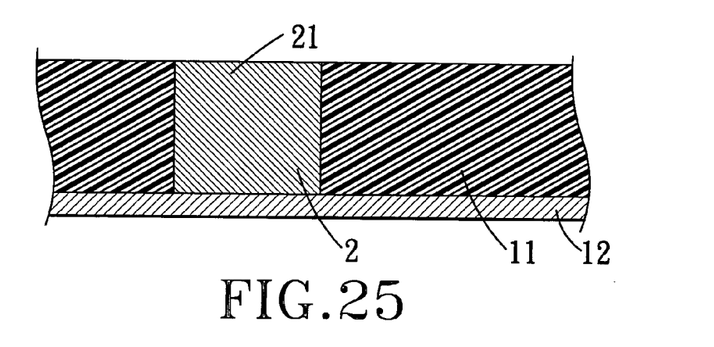
FIG. 25 is a fragmentary sectional view to illustrate how the hole unit is filled with a metal structure in the method of the fourth preferred embodiment.

In step 406, with further reference to FIG. 25, the hole unit 10 (see FIG. 24) is filled with a metal structure 2. The metal structure 2 includes a metal member 21. In this embodiment, the metal member 21 of the metal structure 2 extends from the conductor layer 12 to the second surface 112 of the dielectric layer 11. Preferably, the metal structure 2 is formed by electroforming.

Figure 26:
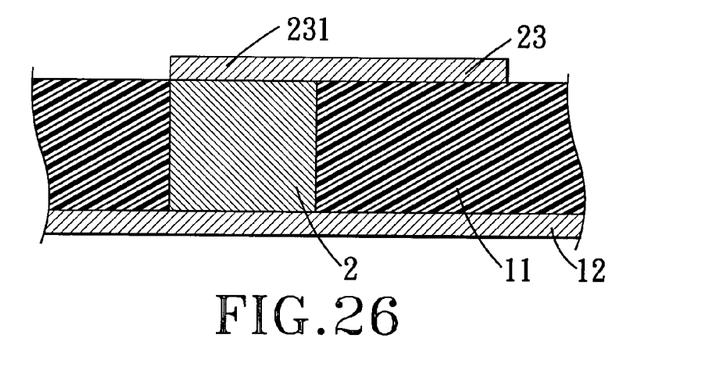
FIG. 26 is a fragmentary sectional view to illustrate a lever member disposed on the dielectric layer according to the method of the fourth preferred embodiment.

In step 408, with further reference to FIG. 26, a lever member 23 is formed on the second surface 112 of the dielectric layer 11, and has a first end 231 connected to the metal member 21 of the metal structure 2 in the hole 301 of the hole unit 10.

Figure 27:
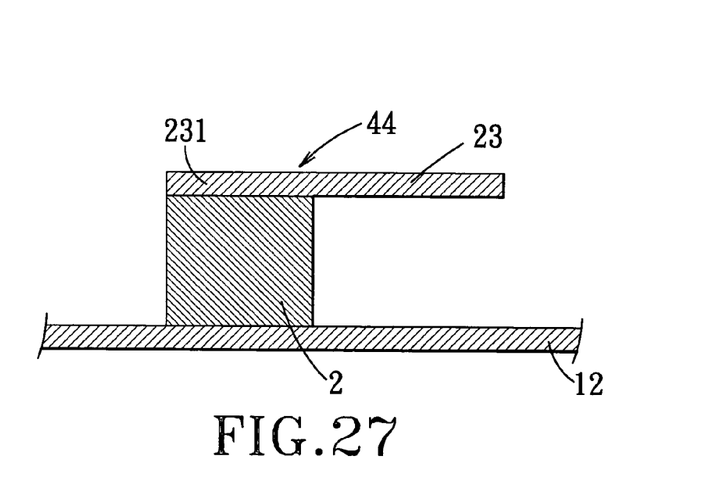
FIG. 27 is a fragmentary sectional view to illustrate how removal of the dielectric layer is conducted in the method of the fourth preferred embodiment.

In step 410, with further reference to FIG. 27, the dielectric layer 11 is removed in its entirety to result in the microstructure 44. In this embodiment, the microstructure 44 is a micro-cantilever structure. The microstructure 44 of this embodiment is suitable for applications such as micro mechanical filters, micro gyroscopes, and micro relays. Preferably, the removal of the dielectric layer 11 is conducted through wet etching.

Figure 28:
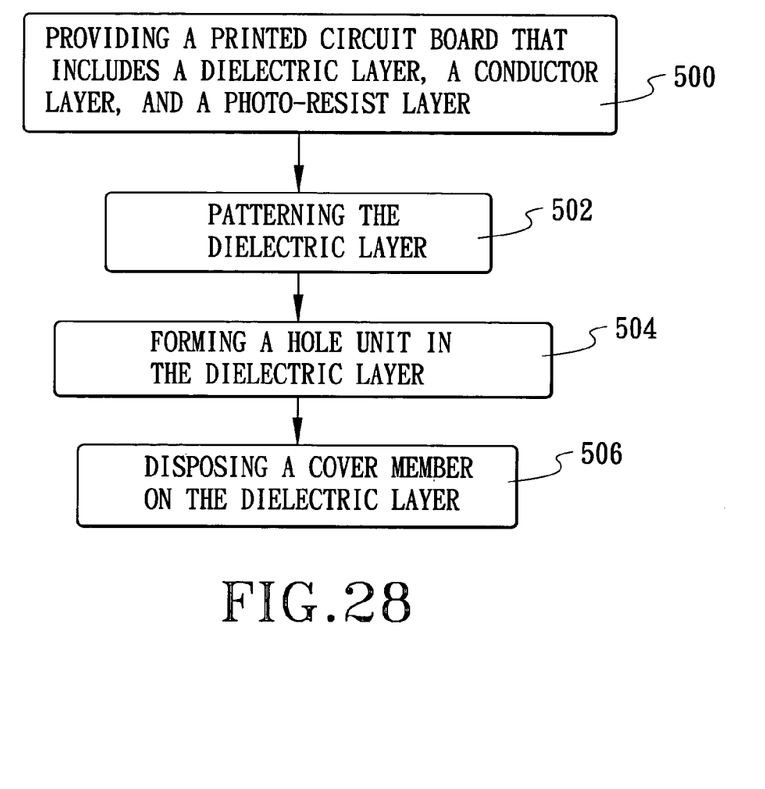
FIG. 28 is a flowchart of the fifth preferred embodiment of a method of making a microstructure using a circuit board according to the present invention.

The fifth preferred embodiment of a method for making a microstructure according to this invention includes the steps as shown in FIG. 28.

Figure 29:
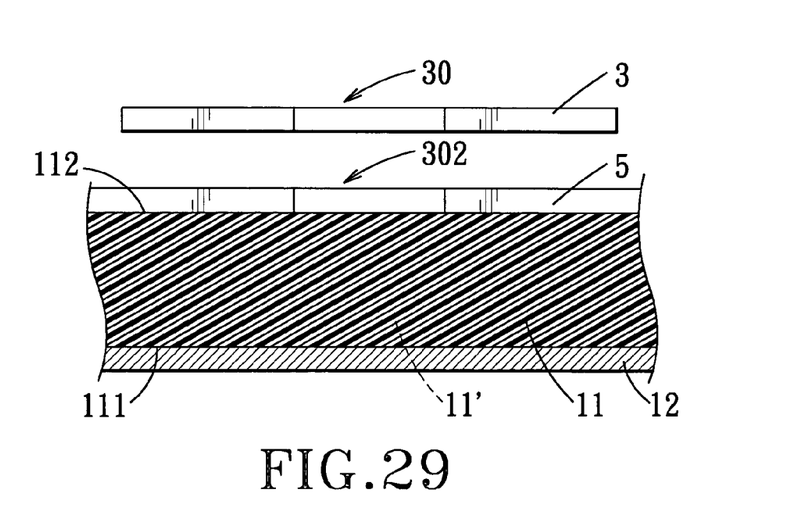
FIG. 29 is a fragmentary sectional view to illustrate how a circuit board having a dielectric layer, a conductor layer, and a photo-resist layer is patterned according to the method of the fifth preferred embodiment.

In step 500, with further reference to FIG. 29, a printed circuit board 1 is provided. The printed circuit board 1 includes a dielectric layer 11 that has a first surface 111 and a second surface 112 opposite to the first surface 111, and a conductor layer 12 formed on the first surface 111 of the dielectric layer 11. In this embodiment, the dielectric layer 11 is made from epoxy resin. The conductor layer 12 is made from copper foil. The printed circuit board 1 further includes a photo-resist layer 5 coated on the second surface 112 of the dielectric layer 11. In step 502, the photo-resist layer 5 is patterned to exposed a part 11' of the second surface 112 of the dielectric layer 11. A photo-mask 3 is patterned with a straight line of a pattern 302 and is then placed on the photo-resist layer 5. The printed circuit board 1 is subsequently exposed to radiation for transferring the pattern 30 on the photo-mask 3 to the photo-resist layer 5. A developing solution is used to form a recess 302 in the photo-resist layer 5 corresponding to the pattern 30.

Figure 30:
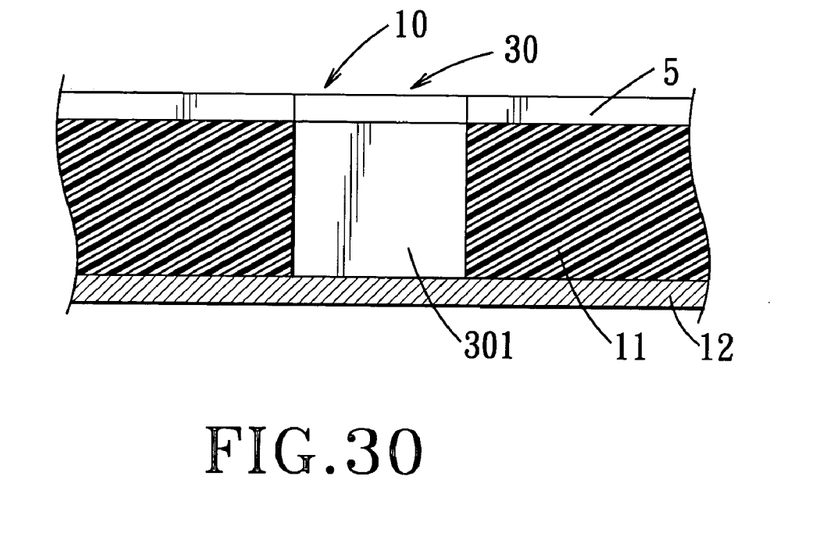
FIG. 30 is a fragmentary sectional view to illustrate how a hole unit is formed in the dielectric layer according to the method of the fifth preferred embodiment.

In step 504, with further reference to FIG. 30, a hole unit 10 is formed in the exposed part 11' (see FIG. 29) of the second surface 112 of the dielectric layer 11. The hole unit 10 includes a hole 301 that is confined by a hole-defining wall and that extends from the second surface 112 to the first surface 111. Preferably, the hole unit 10 is formed by dry or wet etching.

Figure 31:
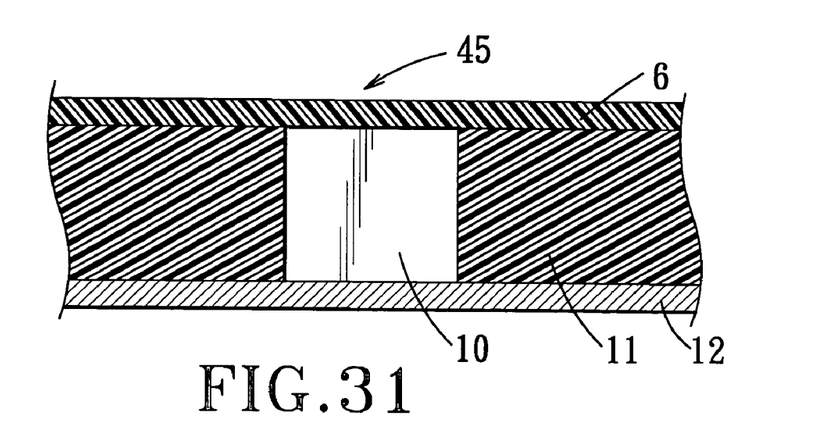
FIG. 31 is a fragmentary sectional view to illustrate how a cover member disposed on the dielectric layer according to the method of the fifth preferred embodiment.
Figure 32:
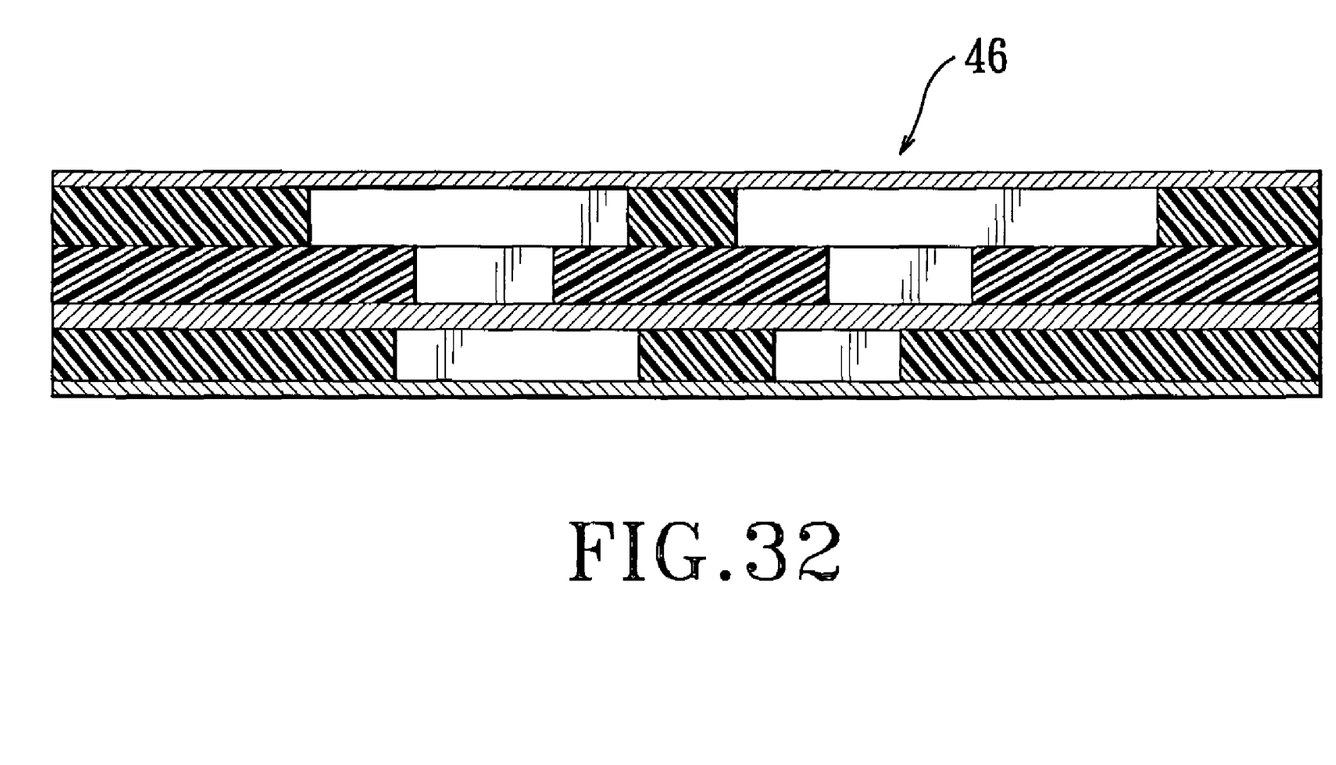
FIG. 32 is a sectional view to illustrate a multi-layer circuit board device that can be fabricated according to the present invention.

In step 506, with further reference to FIGS. 31 and 32, a cover member 6 is disposed on the second surface 112 of the dielectric layer 11 to result in the microstructure 45. In this embodiment, the microstructure 45 is a hollow microstructure that has four sides confined by the hole-defining wall, the conductor layer 12, and the cover member 6. The cover member 6 is in the form of a printed circuit board. As such, printed circuit boards 5 can be stacked and bonded together after processing to result in a multi-layer circuit board device 46, as best shown in FIG. 32. In alternative embodiments, the cover member 6 maybe one of a metal plate, an insulator plate, and an integrated circuit chip.

It is noted that although the metal structure 2 is exemplified as being formed by electroforming, it should be apparent to those skilled in the art that the metal structure 2 may be formed by one of electro-plating, electroless-plating, thin film deposition, and sputtering. Moreover, although the metal structure 2 is exemplified as made of copper, it should be apparent to those skilled in the art that any material suitable for forming the metal structure 2 through electroforming, electro-plating, electroless-plating, thin film deposition, and sputtering may be used. Further, since the first and second conductive layers 12, 12' are made from copper foil, and the first and second metal members 21 of the metal structure 2 are made from copper, each of the microstructures 41, 42, 43, 44 has a high structural strength and good heat conduction characteristics.

It has thus been shown that the method for making microstructures 41, 42, 43, 44, 45 according to this invention includes the step of removing at least a portion 11" of a dielectric layer 11 of a printed circuit board 1. By adding this new step, high aspect ratio microstructures 41, 42, 43, 44, 45 can be fabricated using batch processing techniques at a relatively low cost.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method of making a microstructure on a circuit board that includes a dielectric layer having a first surface and a second surface opposite to the first surface, and a first conductor layer formed on the first surface of the dielectric layer; the method comprising the steps of:
   (A) forming a metal structure on the circuit board, the metal structure extending from the first conductor layer toward the second surface of the dielectric layer, said step A including the sub-steps of
      (a) forming a hole unit in the dielectric layer, the hole unit being formed so it extends from the second surface to the first surface, and
      (b) filling the hole unit with the metal structure; and
   (B) removing at least a portion of the dielectric layer adjacent to the first conductor layer and the metal structure to result in the microstructure having one side defined by the first conductor layer.

2. The method of claim 1, wherein the circuit board further includes a second conductor layer formed on the second surface of the dielectric layer, the sub step (a) including: (i) patterning the second conductor layer to expose parts of the second surface of the dielectric layer, and (ii) forming the hole unit in the exposed parts of the second surface of the dielectric layer.

3. The method of claim 1, wherein the circuit board further includes a photo-resist layer coated on the second surface of the dielectric layer, the sub-step (a) including: (i) patterning the photo-resist layer to expose parts of the second surface of the dielectric layer, and (ii) forming the hole unit in the exposed parts of the second surface of the dielectric layer.

4. The method of claim 1, further comprising the step of: disposing a cover member on the second surface of the dielectric layer after step (B).

5. The method of claim 1, further comprising the step of: forming a lever member on the second surface of the dielectric layer after sub-step (b), the lever member having one end connected to the metal structure in the hole unit.

6. The method of claim 1, wherein removal of the dielectric layer in step (B) is conducted through one of laser ablation, etching, precision machining, and pyrolysis.

* * * * *